(12) United States Patent
Troxell et al.

(10) Patent No.: US 6,180,937 B1
(45) Date of Patent: Jan. 30, 2001

(54) PHOTORESPONSIVE DEVICE FOR DETECTION OF LONG AND SHORT WAVELENGTH PHOTONS

(75) Inventors: John Richard Troxell, Sterling Heights; Charles Neil Stevenson, Troy; Frank J. Schauerte, Berkley, all of MI (US)

(73) Assignee: Delphi Technologies, Inc., Troy, MI (US)

( * ) Notice: Under 35 U.S.C. 154(b), the term of this patent shall be extended for 0 days.

(21) Appl. No.: 09/303,629

(22) Filed: May 3, 1999

(51) Int. Cl.[7] .................................................. H01L 31/00
(52) U.S. Cl. ...................... 250/214.1; 250/208.1
(58) Field of Search .................. 250/214.1, 214 LA, 250/214 LS, 208.1, 214 VT, 214 SG; 257/295, 296, 299, 307, 309, 59

(56) References Cited

U.S. PATENT DOCUMENTS 3,146,352 * 8/1964 Trimble ........................ 250/214 LS

* cited by examiner

Primary Examiner—Que T. Le
(74) Attorney, Agent, or Firm—Jimmy L. Funke

(57) ABSTRACT

A photoresponsive device wherein a plurality of slots is formed in a continuous polycrystalline silicon film that forms a top electrode of the photoresponsive device structure. The resulting "picket fence-like" fingers are capable of generating a depletion region that extends beyond the physical extent of the fingers themselves. The shorter wavelengths of light can reach these unobstructed depletion areas of the substrate and be rapidly detected instead of being absorbed in the electrode. By appropriate spacing of the individual fingers, the individual depletion regions can be effectively merged into one continuous depletion region.

15 Claims, 2 Drawing Sheets

PHOTORESPONSIVE DEVICE FOR DETECTION OF LONG AND SHORT WAVELENGTH PHOTONS

TECHNICAL FIELD

The present invention generally relates to the field of optoelectronic image sensing. More specifically, the present invention relates to a photodetector or other photoresponsive device.

BACKGROUND OF THE INVENTION

Single chip photoresponsive devices are useful for vehicular applications, including occupant detection, vehicle guidance and collision avoidance. Generally, in both automotive and non-automotive applications, photoresponsive devices have been implemented to provide information that is subsequently displayed to the operator of the vehicle or machine. In such applications, providing information in a manner compatible with the human visual system is important to optimize the transfer of information to the operator. For automotive systems, however, the need to display the information is of less importance than the need to electronically analyze the data. Thus, requirements for an automotive photoresponsive device diverge from those of mainstream commercial photoresponsive devices.

Most known imagers integrate active transistors directly into the imager chip. The degree of integration varies depending on both the application and upon the process technology. Imagers that can be formed using a conventional Complementary Metal Oxide Semiconductor (CMOS) process offer the greatest opportunity for peripheral electronics integration and cost reduction.

In a typical CMOS imager, light penetrates various transparent insulating films deposited upon the surface of the wafer for electrical and mechanical protection, and is absorbed in an active device, generally in the form of a photodiode or photocapacitor. It is important to note that the absorption coefficient of light in silicon is inversely proportional to the wavelength of the light. Thus, blue light, which has a shorter wavelength, is absorbed at relatively shallow depths, as compared to red light, which has a longer wavelength and consequently is absorbed more deeply in the silicon.

When a photon strikes a semiconductor it can promote an electron from the valence band to the conduction band creating an electron/hole pair. In order for the absorption of light to be detected in the photoresponsive device, the electron hole pairs that are produced must be separated before they can recombine. This separation is generally accomplished by the application of an electric field, either in the form of a photodiode structure or in the form of a photocapacitor or phototransistor structure. The electric field produces a depletion region in the affected semiconductor region and any free charges in this region are rapidly swept away. Significantly, positive charges are driven in one direction while negative charges are driven in the opposite direction. Consequently, electron/hole pairs are separated before they can recombine and can be detected by external means, and the presence of the original photon can be inferred.

However, the structures required to produce the electric field cover most of the substrate. Existing alternatives use a continuous polycrystalline silicon film that forms the top electrode of the photoresponsive device structure. Generally, a higher optical absorption coefficient for blue light means that a significant amount of the shorter (blue) wavelength light is absorbed in the top layer of silicon. Light absorbed in this region is not detected. Thus, photoresponsive devices typically exhibit poor performance for shorter wavelength light.

A complementary problem is typically observed for long wavelength red and near IR photons. These photons can penetrate relatively deeply into the active charge collection material. In fact, they can penetrate sufficiently deep that adjacent devices can collect the resulting electron/hole pairs, thus reducing the resolution of the image in the long wavelength regions of the optical band.

SUMMARY OF THE INVENTION

It is, therefore, an object of the invention to provide a photoresponsive device with improved sensitivity to light. A further object of the invention is to allow a photoresponsive device to be adjusted for more or less sensitivity to short (blue) wavelength light with respect to its' sensitivity to long (red or near IR) wavelength light.

In one aspect of the invention, a plurality of slots is formed in a continuous polycrystalline silicon film that forms a top electrode of the photoresponsive device structure. The resulting "picket fence-like" fingers are capable of generating a depletion region that extends beyond the physical extent of the fingers themselves. The shorter wavelengths of light can reach these unobstructed depletion areas of the substrate and be rapidly detected instead of being absorbed in the electrode. By appropriate spacing of the individual fingers, the individual depletion regions associated with each finger can be effectively merged into one continuous depletion region.

With the digitated electrode described above, the electrode layer can be made thicker than existing photoresponsive devices and still allow light to reach the substrate. Also, the size of the aperture openings, finger widths and electrode thickness can be adjusted to 'tune' the photoresponsive device to the desired sensitivity to short or long wavelength light.

BRIEF DESCRIPTION OF THE DRAWINGS

The present invention will now be described, by way of example, with reference to the accompanying drawings, in which.

DESCRIPTION OF THE PREFERRED EMBODIMENT

Figure 1:
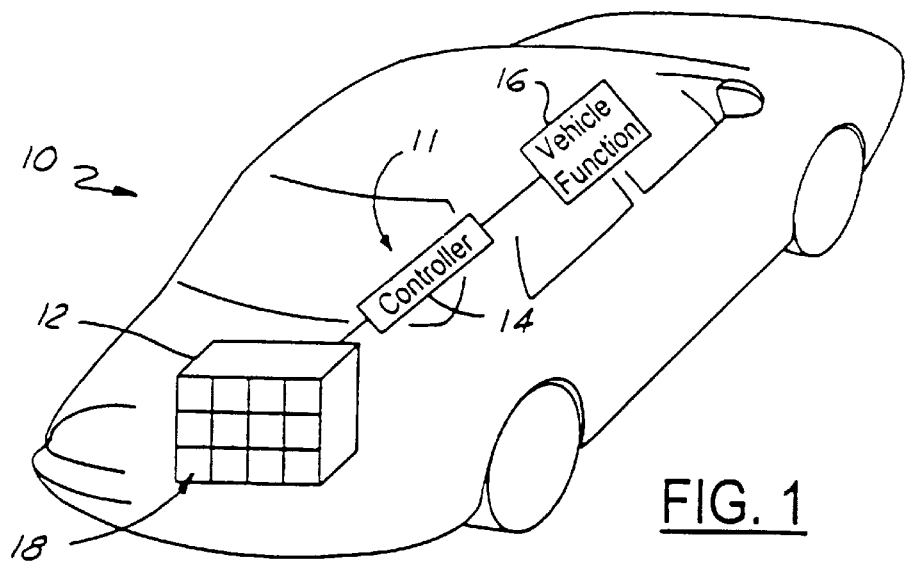
FIG. 1 is a perspective view of a vehicle.

Referring to FIG. 1, a vehicle 10 may use an imaging system 11 for various applications such as occupant detection/protection, vehicle guidance, front/rear collision avoidance or other vision applications. Imaging system 11 consists of a sensor array 12 and a controller 14 that controls a vehicle function 16. Imaging sensor array 12 is made up of a set of photoresponsive elements 18 that convert light to an electronic signal. Controller 14, preferably microcontroller based, analyzes the electronic signals and provides the vehicle function 16 such as described above.

Figure 2:
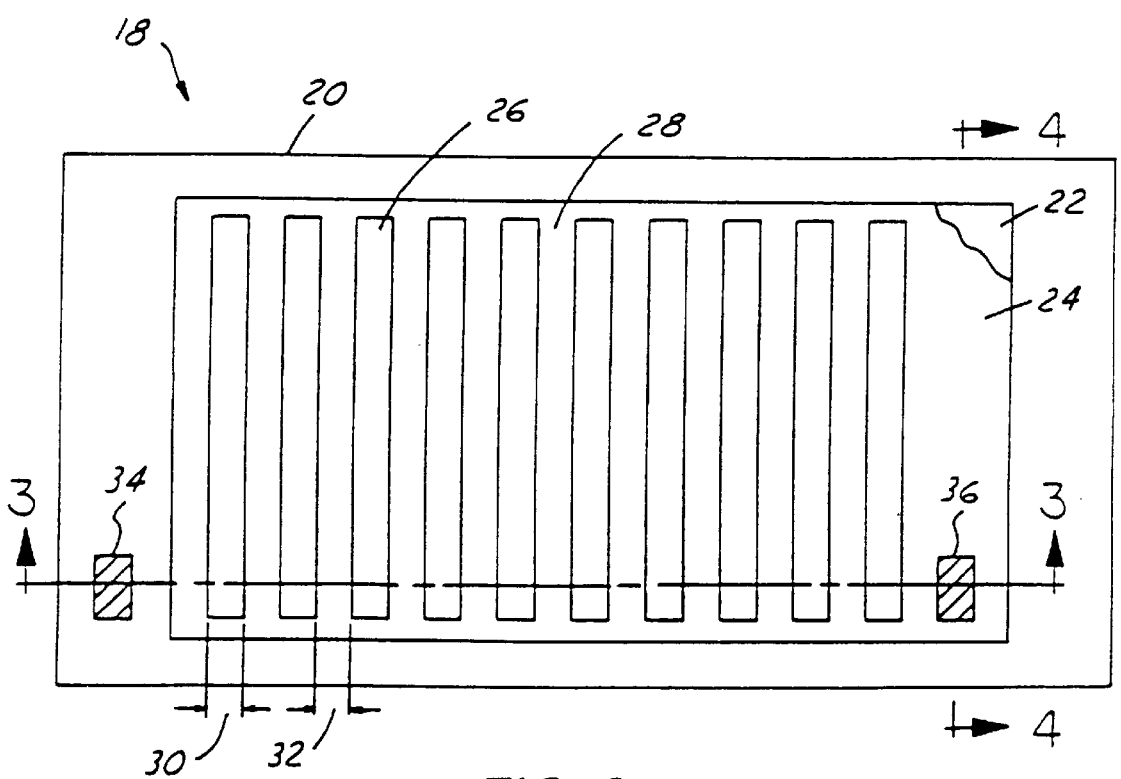
FIG. 2 is a top view of a photoresponsive element formed according to the present invention.
Figure 3:
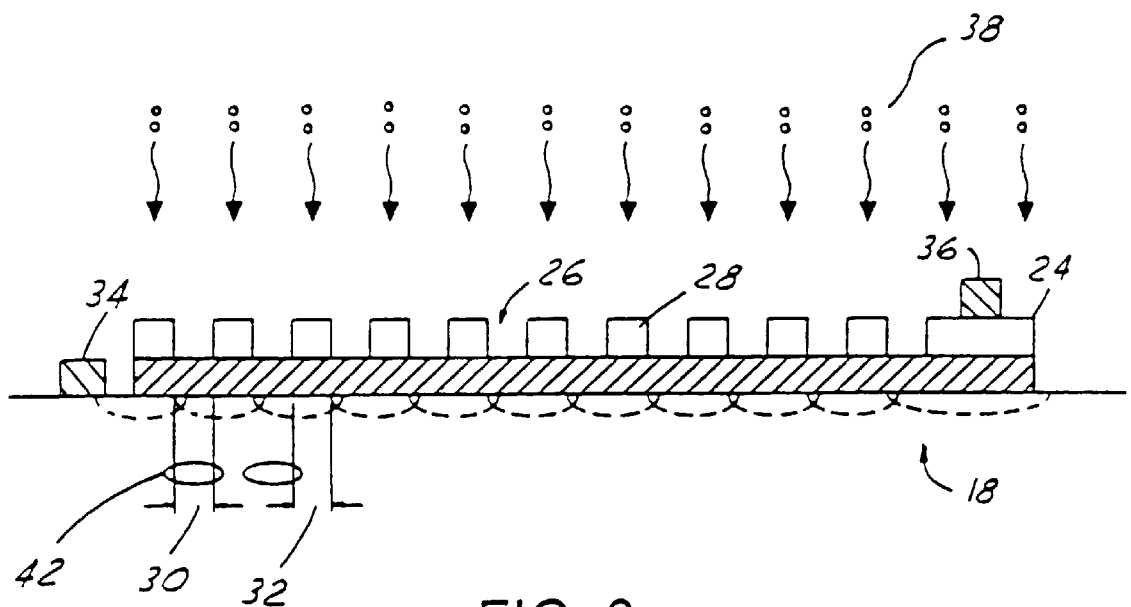
FIG. 3 is a cross sectional view along line 3—3 of FIG. 2.
Figure 4:
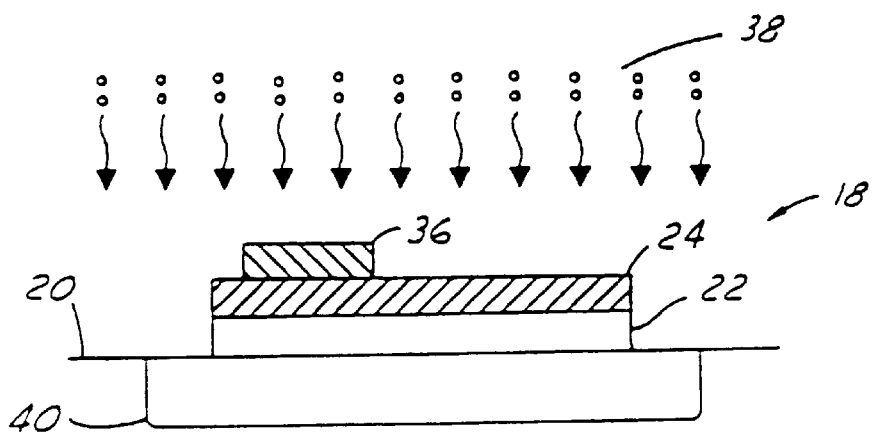
FIG. 4 is a cross sectional view along line 4—4 of FIG. 2.

Referring now to FIGS. 2, 3 and 4 photoresponsive element 18 is illustrated. Photoresponsive element 18 is preferably fabricated using conventional CMOS techniques. One skilled in the art would recognize that photoresponsive elements 18 might also be formed using other techniques.

As will be further described below, photoresponsive element 18 may be implemented as a photocapacitor or a photodiode. For simplicity, the present invention will be described in relation to a photocapacitive implementation.

The photocapacitor embodiment (18) preferably has three layers. A substrate 20, an insulator layer 22 and an electrode layer 24 make up these layers. Insulator layer 22 and electrode layer 24 may be consecutively layered on substrate 20. As will be further described below, depending on the desired characteristics of the photoresponsive element to be fabricated, the presence, doping level, doping type and thickness of each layer may be modified. This particular implementation uses bulk silicon, which also forms the active layers, for conversion of light to electrical energy. However, this invention is also applicable to applications that use additional photon to electron conversion layers (not illustrated) that perform the light-to-electron conversion.

Substrate 20 is preferably a silicon wafer with a doping concentration between $1 \times 10^{14}$ and $1 \times 10^{16}$ cm$^{-3}$. Substrate 20 may have n or p type doping. In the present invention, the silicon wafer preferably is doped with boron to a concentration of $7 \times 10^{14}$ cm$^{-3}$.

Substrate 20 also has a substrate contact 34 for the induction of a bias voltage. Substrate contact 34 can be made of any conductive metal, such as aluminum.

Insulator layer 22 is preferably a high quality (i.e. gate insulator quality) silicon dioxide layer, between 4 and 100 nm in thickness. However, other suitable materials such as silicon nitride or other materials having intentionally high intrinsic bulk or surface charge concentrations to manipulate the extent of a depletion region 40 in the underlying substrate 20 may be employed. In the present example, insulator layer 22 is 40nm thick silicon dioxide.

Electrode layer 24 is preferably a heavily doped polycrystalline silicon film. However, amorphous silicon films and other compositions of conducting films that incorporate silicon or another semiconductor element may be used. Electrode layer 24 may have n or p type doping. In the present invention, electrode layer 24 preferably is polycrystalline silicon 300 nm in thickness doped with phosphorus to provide a resistivity of 11 ohms per square cm. As will be further described below, the thickness of electrode layer 24 may be modified to provide suitable characteristics.

Electrode layer 24 has an electrode layer contact 36 for the induction of a bias voltage. Electrode layer contact 36 can be made of any conductive metal, and preferably aluminum.

Electrode layer 24 has one or more slots, slits or elongated apertures 26 (hereinafter referred to as "slots") with a width 30 to allow photons 38 to pass through electrode layer 24 and reach an unobstructed absorption region 42 in substrate 20. Electrode layer 24 also has one or more fingers 28 defined by slots 26 with a land width 32 for generating depletion region 40 in substrate 20. As will be further described below, slot width 30 and finger width 32 may be modified to provide suitable characteristics. While slots 26 are depicted in FIG. 2 as elongated rectangles, any various shapes of small openings through electrode layer 24 may be used.

A bias voltage is applied to substrate contact 34 and electrode layer contact 36. The resulting electric field forms depletion regions 40 in substrate 20 that extend beyond the edges of fingers 28.

Slot width 30 is chosen so that the depletion region 40 remains relatively continuous through substrate 20. Some photocollection may also occur within approximately a diffusion length of the edge of the depletion region 40, which could allow extension of slot width 30, for some applications. In the preferred embodiment, slot width 30 may be twice the distance that depletion regions 40 extend beyond fingers 28 and land width 32 may be as small as possible. In the present example, slot 30 is 1.9 micrometers in width while land 32 is 1.2 micrometers in width.

Figure 5:
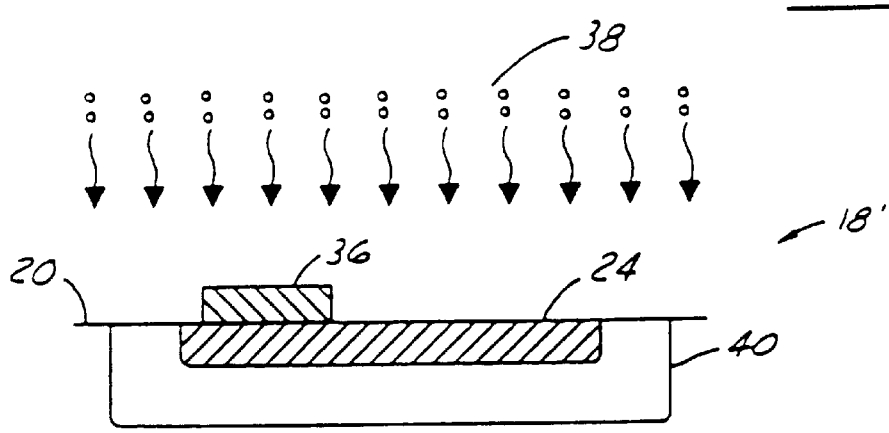
FIG. 5 is a cross sectional view of a photodiode implementation of the present invention.

This device may also be realized with a photodiode embodiment, as depicted in FIG. 5. The main difference being the device 18' shown in FIG. 5 and that described above with reference to FIGS. 2–4, is the lack of insulation layer 22 and the means for inferring incident light.

In operation, some short wavelength photons 38 pass through one or more slots 26 in electrode layer 24 of photoresponsive element 18 and to depletion region 40 in substrate 20 thereby avoiding absorption in electrode layer 24. This allows the short wavelength photons 38 to promote electrons from a silicon valence band to a conduction band in depletion region 40, which generates electron-hole pairs. The voltage bias then sweeps the electrons in one direction and the holes in the opposite direction. These free electrons generate an electronic signal that can then be detected.

Similarly, some long wavelength photons 38 pass through the electrode layer 24 of photoresponsive element 18. This allows the long wavelength photons 38 to promote electrons from silicon valence bands to the conduction bands in depletion region 40, which generates electron-hole pairs. The voltage bias then sweeps the electrons in one direction and the holes in the opposite direction, which generates an electronic signal.

The photoresponsive devices 18 and 18' can also be adjusted to "tune" it to a desired sensitivity to short or long wavelength light. This can be accomplished by changing or adjusting the sizes and/or shapes of the slots or the land areas, and by changing the thickness of the land areas and electrode layer 24.

While the best mode for carrying out the present invention has been described in detail, those familiar with the art to which this invention relates will recognize various alternative designs and embodiments for practicing the invention as defined by the following claims:

1. A photoresponsive element for receiving and converting photons to an electronic signal, comprising:
   a substrate having a substrate contact coupled to a voltage bias;
   an electrode layer adjacent to said substrate, said electrode layer having an electrode layer contact coupled to said voltage bias, said electrode layer having at least two fingers defining a slot formed therein to allow photons to pass through said electrode layer, said slot having a slot width and each finger having a finger width and edges; and
   depletion regions in said substrate created under and extending a distance beyond the edges of said fingers.

2. A device as recited in claim 1 further comprising an insulation layer disposed between said substrate and said electrode layer.

3. A device as recited in claim 1 further comprising a photon to electron conversion layer adjacent to said electrode layer.

4. A device as recited in claim 1 wherein said slot width is twice said distance.

5. A device as recited in claim 1 wherein the thickness of said electrode layer is 300 nanometers or less.

6. A method of detecting short wavelength photons using a photoresponsive element, comprising the steps of:
 passing a photon through a slot in an electrode layer of the photoresponsive element and to a depletion region of a substrate;
 promoting an electron from the valence band to the conduction band in response to the short wavelength photon;
 generating an electron-hole pair; and
 generating an electronic signal in response to said electron-hole pair.

7. A method as recited in claim 6 wherein the step of passing the photon comprises the step of passing the short wavelength photon through an insulation layer disposed between said substrate and said electrode layer.

8. A method of detecting long wavelength photons using a photoresponsive element, comprising the steps of:
 passing a long wavelength photon through an electrode layer of the photoresponsive element and to a depletion region of a substrate to less than a depth of said depletion region;
 promoting an electron from the valence band to the conduction band in response to the long wavelength photon;
 generating an electron-hole pair; and
 generating an electronic signal in response to said electron-hole pair.

9. A method as recited in claim 8 wherein the step of passing the long wavelength photon comprises the step of passing the long wavelength photon through an insulation layer disposed between said substrate and said electrode layer.

10. An imaging system for receiving an optical image and providing a function, comprising:
 a sensor array having a plurality of photoresponsive elements for receiving and converting photons to an electronic signal, each photoresponsive element, having;
 a substrate having a substrate contact coupled to a voltage bias;
 an electrode layer adjacent to said substrate, said electrode layer having an electrode layer contact coupled to said voltage bias, said electrode layer having at least two fingers defining a slot formed therein to allow photons to pass through said electrode layer, said slot having a slot width and each fingers having a finger width and edges;
 depletion regions in said substrate created under and extending a distance beyond the edges of said fingers;
 said plurality of photoresponsive elements arranged so as to form a matrix-addressable imaging plane;
 a controller coupled to said imaging system; and
 a function generated by said controller in response to said electronic signal.

11. An imaging system as recited in claim 10 wherein said photoresponsive element further comprises an insulation layer disposed between said substrate and said electrode layer.

12. An imaging system is recited in claim 10 wherein said photoresponsive element further comprises a photon to electron conversion layers adjacent to said electrode layer.

13. An imaging system as recited in claim 10 wherein said slot width of said photoresponsive element is twice said distance.

14. An imaging system as recited in claim 10 wherein said electrode layer of said photoresponsive element is 300 nanometers thick or less.

15. An imaging system as recited in claim 10 wherein a spacing between said plurality of photoresponsive elements generates a continuous depletion region within said substrate.

\* \* \* \* \*